(12) United States Patent
Watanabe

(10) Patent No.: US 6,498,537 B1
(45) Date of Patent: Dec. 24, 2002

(54) PHASE COMPARISON CIRCUIT HAVING A CONTROLLED DELAY OF AN INPUT SIGNAL

(75) Inventor: Seiji Watanabe, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/267,195

(22) Filed: Mar. 12, 1999

(30) Foreign Application Priority Data

Mar. 12, 1998 (JP) .............................................. 10-061706

(51) Int. Cl.$^7$ ................................................. H03H 5/00
(52) U.S. Cl. .......................................... 331/25; 375/360
(58) Field of Search ............................ 331/25; 360/51; 375/354, 360

(56) References Cited

U.S. PATENT DOCUMENTS 4,984,255 A * 1/1991 Davis et al. ................. 375/106
5,592,110 A * 1/1997 Noguchi ....................... 327/12

* cited by examiner

Primary Examiner—Robert Pascal
Assistant Examiner—Kimberly Glenn
(74) Attorney, Agent, or Firm—William B. Kempler; W. James Brady; Frederick J. Telecky, Jr.

(57) ABSTRACT

A phase comparison circuit capable of realizing high-speed response by the PLL circuit in order to realize high-speed reproduction of the signals. An input signal is delayed by a delay buffer in order to produce a delayed signal. Changes in the level of the input signal are detected by a leading edge detection circuit and a falling edge detection circuit, a first and a second edge detection signals are output a control circuit changes the level of an output signal according to these detection signals, a phase comparison circuit compares the phases of the output from the control circuit and the clock signal, and a first and a second control signals are output according to the comparison result. In response to the first and the second control signals from the phase comparison circuit, a charge pump circuit outputs a phase difference signal corresponding to the phase difference between the aforementioned delayed signal and the clock signal and holds the phase difference signal to a high-impedance state when the aforementioned delayed signal and the clock signal are synchronous.

21 Claims, 7 Drawing Sheets

PHASE COMPARISON CIRCUIT HAVING A CONTROLLED DELAY OF AN INPUT SIGNAL

FIELD OF THE INVENTION

The present invention pertains to a phase comparison circuit for a PLL circuit used to regenerate a clock signal from EFM data or other encoded data for a phase comparison circuit, such as a data reproduction device for CD or DVD or a receiver of an ISDN data transmission device.

BACKGROUND OF THE INVENTION

In a data reproduction device for CD or DVD, a PLL circuit is used to regenerate a clock signal from EFM modulated data obtained by means of an optical detection circuit. Similarly, a PLL circuit is used on the receiver side of an ISDN data transmitting device in order to regenerate a clock signal based on the received encoded data. In either case, the PLL is provided with a phase comparison circuit for phase comparison.

Clock signals are generated by respective data reproduction devices for CD such that the maximum read cycle of EFM data becomes 11 times the regenerated clock signal, and for DVD, the maximum read cycle of EFM data becomes 14 times the regenerated clock signal.

In general, at the PLL circuit, after the clock signal generated by means of a voltage control oscillator (VCO) is divided at a prescribed dividing ratio using a frequency divider, comparison of the frequency or phase with that of the read EFM data is performed. According to the result of the comparison of frequency or phase, a control signal reflecting the error is generated in order to control the frequency and the phase of the signal oscillated by the VCO, so that a clock signal having a specific frequency and phase can be regenerated. In addition, the regenerated clock signal is used, for example, as a clock signal for DSP signal processing.

Because the phase comparison circuit in the PLL circuit of the aforementioned conventional data reproduction device generates a pulse having both positive and negative polarities corresponding to phase difference, and the signal obtained through the integration of said pulse signal is used as the control signal of VCO, there is a disadvantage that the reply (response) of the PLL circuit is slow. In the case of the reproduction device of a high-speed CD or a DVD, a high-speed response is necessary, and the phase comparison circuit in the PLL circuit of the current reproduction device needs to be improved.

The present invention was made in the light of this circumstance, and its purpose is to present a phase comparison circuit capable of realizing high-speed response of the PLL circuit and high-speed regeneration of signals.

SUMMARY OF THE INVENTION

In order to achieve the aforementioned purpose, the phase comparison circuit of the present invention has a delay circuit that adds a prescribed delay time of either a first or a second value to an input signal in order to output a delayed signal, a first edge detection circuit that outputs a first edge detection signal upon detecting the changing edge at which the aforementioned input signal changes from the first level to the second level, a second edge detection circuit that outputs a second edge detection signal upon detecting the changing edge at which the aforementioned input signal changes from the second level to the first level, a phase detection circuit that outputs a first control signal by comparing the phase of the aforementioned delayed signal and the phase of a clock signal when the aforementioned first detection signal is output and outputs a second control signal by comparing the phase of the aforementioned delayed signal and the phase of a clock signal when the aforementioned second detection signal is output, and an output circuit that outputs a phase difference signal indicating the phase difference between the aforementioned delayed signal and the aforementioned clock signal according to the aforementioned first and the second control signals.

In addition, the phase comparison circuit of the present invention has a delay circuit that adds a prescribed delay time of either a first or a second value to an input signal in order to output a delayed signal, a first edge detection circuit that outputs a first edge detection signal upon detecting the changing edge at which the aforementioned input signal changes from the first level to the second level, a second edge detection circuit that outputs a second edge detection signal upon detecting the changing edge at that the aforementioned input signal changes from the second level to the first level, a control circuit which receives the aforementioned delayed signal and the aforementioned first and second edge detection signals and outputs a phase information signal corresponding to said signals, a phase detection circuit that outputs a first and a second control signal by comparing the phase of the aforementioned phase information signal and the phase of the clock signal, and an output circuit that outputs a phase difference signal indicating the phase difference between the aforementioned delayed signal and the aforementioned clock signal according to the aforementioned first and second control signal.

In addition, the present invention preferably controls the frequency of the aforementioned clock signal and the aforementioned delay time according to the aforementioned phase difference signal. Also, control is performed in such a way that the aforementioned delay time becomes shorter as the frequency of the aforementioned clock signal becomes higher.

Furthermore, the present invention preferably holds the aforementioned phase difference signal at a first level corresponding to the aforementioned first control signal and at a second level corresponding to the aforementioned second control signal. Moreover, the aforementioned phase difference signal enters a high-impedance state when the aforementioned delayed signal and the aforementioned clock signal are synchronous.

In the present invention, changing edges of the input signal are detected by the first and second edge detection circuits, and a first and second edge detection signal are output, respectively. In addition, a delayed signal, for which a prescribed delay time is added to an input signal, is output by the delay circuit. Phase of the aforementioned delayed signal and the phase of the clock signal are compared by the phase comparison circuit when a change has occurred in the aforementioned input signal, that is, when the aforementioned first or the second edge detection signal is output, and a first and second signal are output according to the result of said comparison. Furthermore, a phase difference signal indicating the phase difference between the aforementioned delayed signal and the aforementioned clock signal is output from the output circuit according to the control signals. For example, a positive pulse is generated for the phase difference signal when the phase of the aforementioned delayed signal is ahead of that of the aforementioned clock signal; and, on the contrary, a negative pulse is generated for the phase difference signal when the phase of the aforementioned delayed signal is behind that of the aforementioned clock signal. In addition, when the phases of the aforementioned delayed signal and the aforementioned clock signal are synchronous, the aforementioned phase difference signal is held at a high-impedance state.

The aforementioned clock signal is obtained from the output signal from the voltage control oscillation circuit whose oscillation frequency corresponds to the aforementioned phase difference signal, and frequency of the aforementioned clock signal is controlled according to the aforementioned input signal. Because the PLL circuit configured with this kind of phase comparison circuit has a good response characteristic and is capable of responding quickly to the input signal, for example, high-speed reproduction of recorded data can be achieved in a CD or a DVD reproduction device.

REFERENCE NUMERALS AS SHOWN IN THE FIGURES

10 represents phase comparison circuit, 20 a frequency comparison circuit, a 30 low-pass filter, 40, 50 a frequency divider, a 60 VCO, a 100, 100a, 100b a phase comparison circuit, a 110 delay buffer, 120 a leading edge detection circuit, 122 a NAND gate, 124 D a flip-flop, 130 a falling edge detection circuit, 132 a NAND gate, 134 a D flip-flop, 136 an inverter, 140 a phase detection control circuit, 141, 142 a AND gate, 143, 144 an OR gate, 145 an inverter, 150, 150-1, 150-2 a phase detection circuit, 151, 152, 155, 156 a D flip-flop, 153, 157 a NAND gate, 154 an inverter, 160 a charge pump circuit 161, 162 an OR gate, 163 a simultaneous switch prevention circuit, 164 a pMOS transistor, 165 a nMOS transistor, 166 an inverter, 170 an AND gate, 180 an OR gate, 190 a shift register.

DESCRIPTION OF THE EMBODIMENTS

Figure 1:
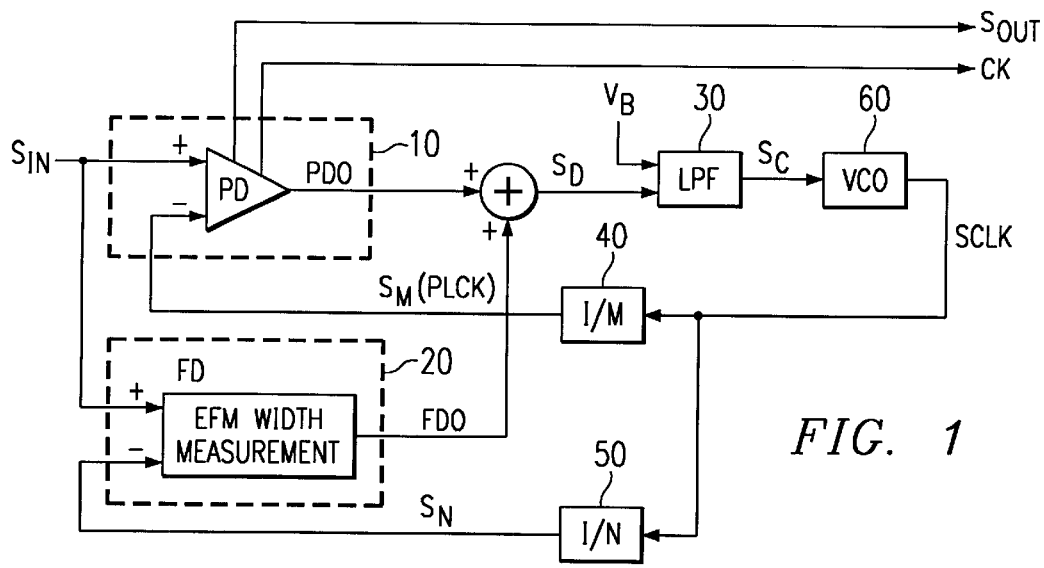
FIG. 1 is a circuit diagram showing an embodiment of the PLL circuit pertaining to the present invention.

FIG. 1 is a diagram showing an embodiment of the phase comparison circuit pertaining to the present invention. This figure is a block diagram of the PLL circuit configuration. As shown in the figure, the PLL circuit of the present example is configured with a phase comparison circuit (10), a frequency comparison circuit (20), a low-pass filter (30), frequency dividers (40) and (50), and a VCO (60).

The phase comparison circuit (10) compares the phase of the input signal ($S_{IN}$) with the phase of the divided signal ($S_M$) (PLCK) from the frequency divider (40) in order to generate an error signal (PDO) corresponding to the phase difference in these signals. Furthermore, the input signal ($S_{IN}$) to the phase comparison circuit (10) comprises EFM modulated data obtained, for example, through the optical detection circuit of a CD or DVD. Regenerated clock signal (CK) is output from the phase comparison circuit (10) along with the regenerated EFM data ($S_{OUT}$).

The frequency comparison circuit (20) compares the frequency of the input signal ($S_{IN}$) with the frequency of the divided signal ($S_N$) from the frequency divider (50) and outputs an error signal (FDO) corresponding to the difference in the frequencies of these signals. As shown in the figure, the frequency comparison circuit (20) has a pulse measuring circuit to measure the pulse width of the input signal ($S_{IN}$), for example; whereby the difference between the frequency of the input signal ($S_{IN}$) and the frequency of the divided signal ($S_N$) is obtained by measuring the EFM pulse width of the divided signal ($S_N$) in order to generate an error signal (FDO) corresponding to said difference in frequency.

The error signal (PDO) generated by the phase comparison circuit (10) and the error signal (FDO) generated by the frequency comparison circuit (20) are added by an adder, and a signal ($S_D$) which is the result of the addition is input into the low-pass filter (30). Additionally, a bias voltage ($V_B$) is input into the low-pass filter (30).

Using the bias voltage ($V_B$) as a reference signal, the low-pass filter (30) removes the high-frequency elements of the resulting signal ($S_D$) from the addition, generates a control signal ($S_C$) that only contains the low-frequency elements, and supplies it to the VCO (60).

In response to the control signal ($S_C$) from the low-pass filter (30), the VCO (60) controls the oscillation frequency in order to output a clock signal (SCLK).

The clock signal (SCLK) from the VCO (60) is input into the frequency dividers (40) and (50), respectively. The clock signal (SCLK) is divided by M at the frequency divider (40), and the divided signal ($S_M$) (PLCK) is supplied to the phase comparison circuit (10). The clock signal (SCLK) is divided by N at the frequency divider (50), and the divided signal ($S_N$) is supplied to the frequency comparison circuit (20).

In the case of the PLL circuit shown in FIG. 1, once the operation begins, first, the frequency comparison circuit (20) detects the largest width of EFM data that constitutes the input signal ($S_{IN}$) based on the divided signal ($S_N$) from the frequency divider (50). For example, assuming that frequency of the clock signal (SCLK) from the VCO (60) is expressed as $T_{CK}$, an error signal (FDO) is generated such that the largest width of the EFM data becomes $11T_{CK}$ in the case of a CD, and the largest width of the EFM data becomes $14T_{CK}$ in the case of a DVD, and fed back to the VCO (60) via the low-pass filter (30). As a result, oscillation frequency of the VCO (60) reaches a desired frequency. This control process is referred to as frequency tuning.

After the frequency tuning is completed, the phase comparison circuit (10) carries out phase synchronization control. At this time, phase of the EFM data and the phase of the divided signal ($S_M$) (PLCK) from the frequency divider (40) are compared by the phase comparison circuit (10). Then, a phase error signal (PDO) is output corresponding to the phase difference between the input signal ($S_{IN}$) and the divided signal ($S_M$). After the high-frequency components are removed by the low-pass filter (30), the phase error signal (PDO) is supplied to the VCO (60) as a control signal to control the phase of the oscillation signal of the VCO (60), so that phase synchronization of the clock signal (SCLK) from the VCO (60) with the EFM data can be achieved. Once the phase synchronization is achieved, it is output as a clock signal (CK) that was generated based on the clock signal (SCLK) and used, for example, as a system clock signal for a signal processing circuit, such as a DSP. In addition, the EFM data, whose synchronization with the clock signal (SCLK) is held to the phase comparison circuit (10), is output as regenerated EFM data.

Figure 2:
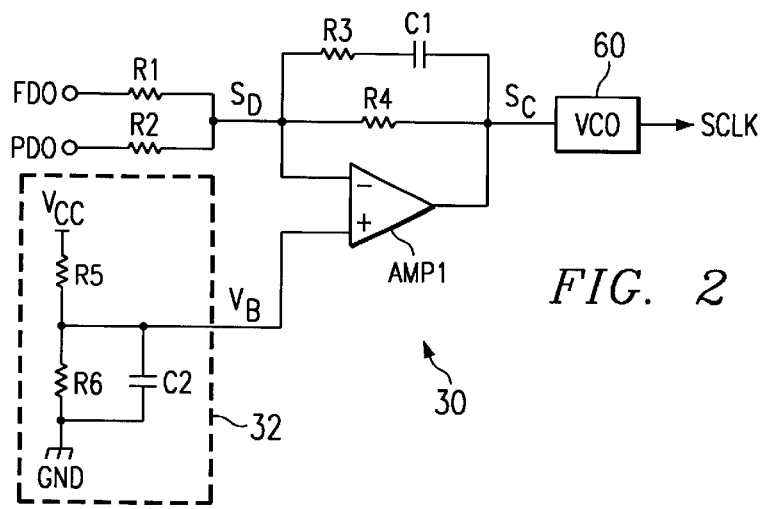
FIG. 2 is a circuit diagram showing the configuration of the low-pass filter which constitutes the PLL circuit.

FIG. 2 is a circuit diagram showing an example of the configuration of the low-pass filter (30). As shown in the figure, the low-pass filter (30) is configured with a differential amplifier (AMP1), resistors (R3) and (R4), and a capacitor (C1).

The output signal (FDO) from the frequency comparison circuit (20) and the output signal (PDO) from the phase comparison circuit (10) are connected to an inverted input terminal "−" of the differential amplifier (AMP1) via resistors (R1) and (R2), respectively. A bias voltage ($V_B$) generated by a bias generating circuit (32) is connected to a non-inverted input terminal "+" of the differential amplifier (AMP1).

The bias generating circuit (32) is configured with resistors (R5) and (R6) and a capacitor (C2). The resistors (R5) and (R6) are connected in series between the source voltage ($V_{CC}$) and the ground potential (GND). The capacitor (C2) is connected in parallel to the resistor (R6). That is, the bias voltage ($V_B$) is a potential voltage created due to the resistors (R5) and (R6), and the voltage value of the bias voltage ($V_B$) can be controlled by changing the resistance values of the resistors (R5) and (R6). The capacitor (C2) is provided to suppress high-frequency noise in the bias voltage ($V_B$).

The resistor (R3) is connected to the capacitor (C1) in series, and these two components are connected in parallel with the resistor (R4), at the low-pass filter (30). A feedback loop containing these elements connects the output terminal and the inverted input terminal "−" of the differential amplifier (AMP1). The error signal (PDO) from the frequency comparison circuit (20) and the error signal (FDO) from the phase comparison circuit (10) are combined at the inverted input terminal "−" of the differential amplifier (AMP1), and an addition result signal ($S_D$) is generated and connected to the inverted input terminal "−" of the differential amplifier (AMP1). High-frequency elements contained in the addition result signal ($S_D$) are removed at the differential amplifier (AMP1), and a signal ($S_C$) containing only the low-frequency elements is generated and supplied to the VCO (60) as a control signal. A clock signal (SCLK) with a specific frequency and phase is generated by the VCO (60).

Figure 3:
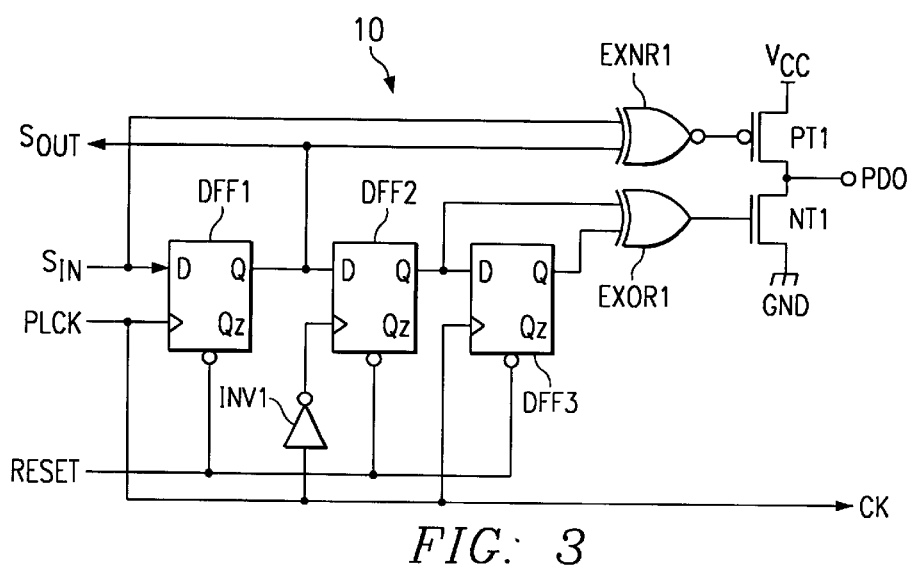
FIG. 3 is a circuit diagram showing an example of the phase comparison circuit currently used widely.

FIG. 3 is a circuit diagram showing an example of the configuration of a phase comparison circuit (10) currently widely used. As shown in the figure, said phase comparison circuit (10) is configured with D flip-flops (DFF1), (DFF2), and (DFF3), an inverter (INV1), an exclusive NOR gate (EXNIVR1), an exclusive OR gate (EXOR1), a pMOS transistor (PT1), and an nMOS transistor (NT1).

An input signal ($S_{IN}$), which could be, for example, EFM data detected by an optical detection circuit, is connected into an input terminal of the D flip-flop (DFF1). A clock signal (PLCK) is connected to a clock input terminal of the D flip-flop (DFF1).

The D flip-flops (DFF1), (DFF2), and (DFF3) are connected in series. That is, output terminal (Q) of D flip-flop (DFF1) is connected to the input-terminal (D) of D flip-flop (DFF2), and the output terminal (Q) of D flip-flop (DFF2) is connected to the input terminal (D) of D flip-flop (DFF3).

Inverted signal of the clock signal (PLCK) is connected to the clock input terminal of the D flip-flop (DFF2), and the clock signal (PLCK) is connected to the clock input terminal of the D flip-flop (DFF3).

The input signal ($S_{IN}$) and the output signal from the D flip-flop (DFF1) are connected to the exclusive NOR gate (EXNIVR1), and the output signal of the exclusive NOR gate (EXNIVR1) is applied to the gate of the pMOS transistor (PT1). Output signal of the D flip-flop (DFF2) and output signal of the D flip-flop (DFF3) are connected to the exclusive OR gate (EXOR1), and output signal of the exclusive OR gate (EXOR1) is applied to the gate of the nMOS transistor (NT1).

The pMOS transistor (PT1) and an nMOS transistor (NT1) are connected in series between the source voltage ($V_{CC}$) and the ground potential (GND). That is, source of the pMOS transistor (PT1) is connected to the source voltage ($V_{CC}$), the drain is connected to the drain of the nMOS transistor (NT1), and source of the nMOS transistor (NT1) is grounded. The connection point of the drains of the pMOS transistor (PT1) and the nMOS transistor (NT1) constitutes the output terminal of the phase comparison circuit (10), and a phase error signal (PDO) is output from said output terminal.

For example, because the pMOS transistor (PT1) is turned ON, and the nMOS transistor (NT1) is turned OFF when the output terminal of the exclusive NOR gate (EXNIVR1) and the output terminal of the exclusive OR gate (EXOR1) are both low, the error signal (PDO) is set high, that is, to the source voltage ($V_{CC}$) level. On the other hand, because the pMOS transistor (PT1) is turned OFF, and the nMOS transistor (NT1) is turned ON when the output terminal of the exclusive NOR gate (EXNIVR1) and the output terminal of the exclusive OR gate (EXOR1) are both set high, the error signal (PDO) is set low, that is, to the ground potential (GND) level.

Furthermore, output signal ($S_{OUT}$) of the D flip-flop (DFF1) is output to the outside as regenerated EFM data. In addition, in-phase signal of the clock signal (PLCK) is output as a clock signal (CK).

Figure 4:
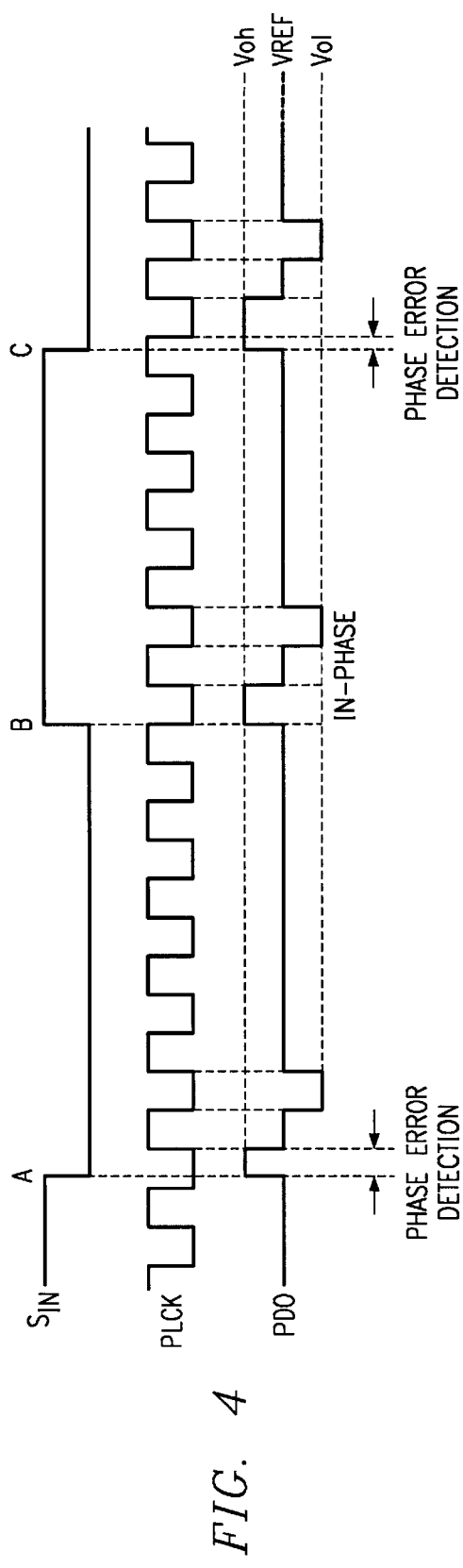
FIG. 4 is a waveform diagram showing the operation of the phase comparison circuit shown in FIG. 3.

FIG. 4 is a waveform diagram of the phase comparison circuit (10) shown in FIG. 3. Operation of the phase comparison circuit (10) of the present example will be explained below in reference to FIG. 4.

In FIG. 4, the input signal ($S_{IN}$), that is, EFM data, is a pulse signal having different widths. An error signal (PDO)

is output from the phase comparison circuit (10) at the respective changing edges (leading edge and falling edge) of said input signal ($S_{IN}$)

As shown in the figure, the changing edge (A) of the input signal ($S_{IN}$), that is, at the falling edge from high to low, the error signal (PDO) is switched from low to high. The error signal (PDO) is held high until the next leading edge of the clock signal (PLCK). The error signal (PDO) is held at the reference level (VREF) at the next leading edge of the clock signal (PLCK). Then, the error signal (PDO) is held low during the half cycle after the falling edge of the clock signal (PLCK).

The clock signal (PLCK) falls synchronous with the changing edge of the input signal ($S_{IN}$) at the changing edge (B), that is, leading edge, of the input signal ($S_{IN}$). Following the fall of the clock signal (PLCK), the error signal (PDO) is switched from the low to high. Then, the error signal (PDO) is switched to the reference level (VREF) at the leading edge of the clock signal (PLCK). The error signal (PDO) is switched to low at the next falling edge of the clock signal (PLCK), and the error signal (PDO) is held low level during the half cycle of the clock signal (PLCK).

The error signal (PDO) is switched from low to high at the changing edge (C), that is, at the falling edge, of the input signal ($S_{IN}$) and switched to the reference level (VREF) by the next leading edge of the clock signal (PLCK). Then, the error signal (PDO) is switched to low at the next falling edge of the clock signal (PLCK) and held low during the half cycle of the clock signal (PLCK).

Once the resulting error signal (PDO) in FIG. 4 is integrated by the low-pass filter (30) shown in FIG. 2, that is, when high-frequency components are removed, it can be used as a control signal for controlling the oscillation frequency of the VCO (60). However, in such a case, because integration processing is performed, response of the control signal becomes slow. In order to handle reading from a high-speed CD or a DVD, the response characteristic of the reading device must be improved.

First Embodiment of Phase Comparison Circuit

Figure 5:
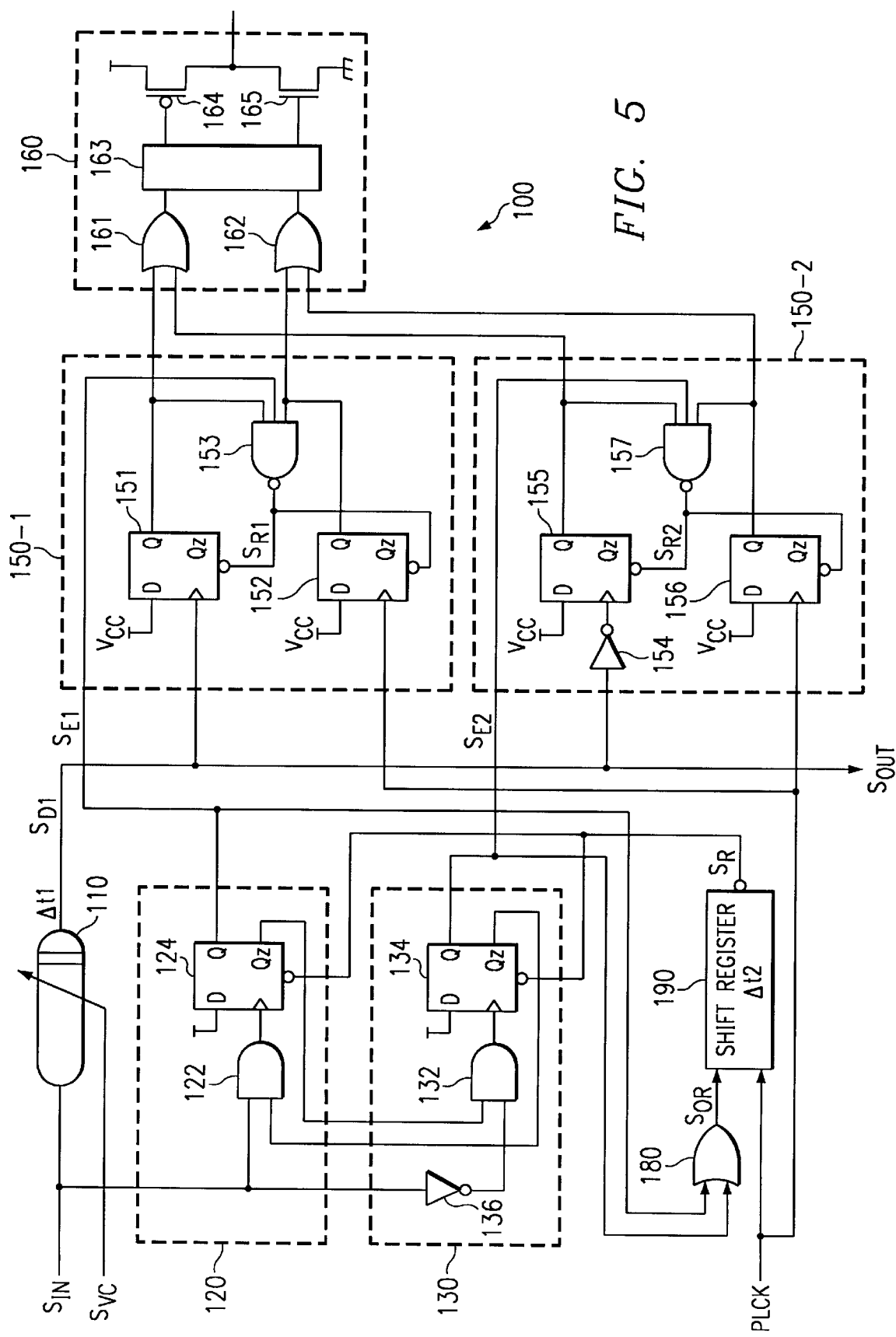
FIG. 5 is a circuit diagram showing a first embodiment of the phase comparison circuit of the present invention.

FIG. 5 is a circuit diagram showing an example of the configuration of the phase comparison circuit (100) of the present invention. As shown in the figure, the phase comparison circuit (100) of the present example is configured with a voltage control delay-buffer (110), a leading edge detection circuit (120), a falling edge detection circuit (130), phase detection circuits (150-1) and (150-2), a charge pump circuit (160), an OR gate (180), and a shift register (190). The input signal ($S_{IN}$) comprises, for example, EFM data detected by means of an optical detection circuit.

The voltage control delay buffer (hereinafter referred to as delay buffer) (110) adds a delay time ($\Delta t\,1$) to the input signal ($S_{IN}$) according to the input of a voltage control signal ($S_{VC}$) Furthermore, assuming that cycle of the clock signal (PLCK) to be generated based on the output signal of VCO is expressed as T, delay time ($\Delta t\,1$) of the delay buffer (110) meets the following equation.

$$0.5T < \Delta t\,1 < 0.75T \quad (1)$$

The leading edge detection circuit (120) and the falling edge detection circuit (130) detect leading and falling edges of the input signal ($S_{IN}$), respectively. A leading edge detection signal ($S_{E1}$) and a falling edge detection signal ($S_{E2}$) are generated according to the timing of the detected leading edge and falling edge and supplied to the phase detection circuits (150-1) and (150-2), respectively.

As shown in the figure, the leading edge detection circuit (120) is configured with an AND gate (122) and a D flip-flop (124). The falling edge detection circuit (130) is configured with an AND gate (132), a D flip-flop (134), and an inverter (136).

In the leading edge detection circuit (120), the input signal ($S_{IN}$) is connected to one of the input terminals of the AND gate (122); and an output signal from the inverted output terminal ($Q_Z$) of the D flip-flop (134), which is contained in the falling edge detection circuit (130), is connected to the other input terminal.

In the falling edge detection circuit (130), the output signal from the inverter (136) is connected to one of the input terminals of the AND gate (132); and an output signal from the inverted output terminal ($Q_Z$) of the D flip-flop (124), which is contained in the leading edge detection circuit (120), is connected to the other input terminal. The input signal ($S_{IN}$) is applied to the input terminal of the inverter (136).

The output signal from the output terminal (Q) of the D flip-flop (124) is output to the phase detection circuit (150-1) as the leading edge detection signal ($S_{E1}$), and the output signal from the output terminal (Q) of the D flip-flop (134) is output to the phase detection circuit (150-2) as the falling edge detection signal ($S_{E2}$).

The leading edge detection signal ($S_{E1}$) and the falling edge detection signal ($S_{E2}$) are both connected to the OR gate (180).

Output signal from the OR gate (180) is input to the shift register (190). Output signal ($S_R$) from the shift register (190) is supplied as a D flip-flop reset signal for both D flip-flops (124) and (134)

A clock signal (PLCK), generated based on the output signal from the OR gate (180) and the output signal from the VCO, is input to the shift register (190), a prescribed delay time ($\Delta t2$) is added to the output signal from the OR gate (180), and the delayed signal ($S_R$) is output as a reset signal into the D flip-flops (124) and (134).

Figure 6:
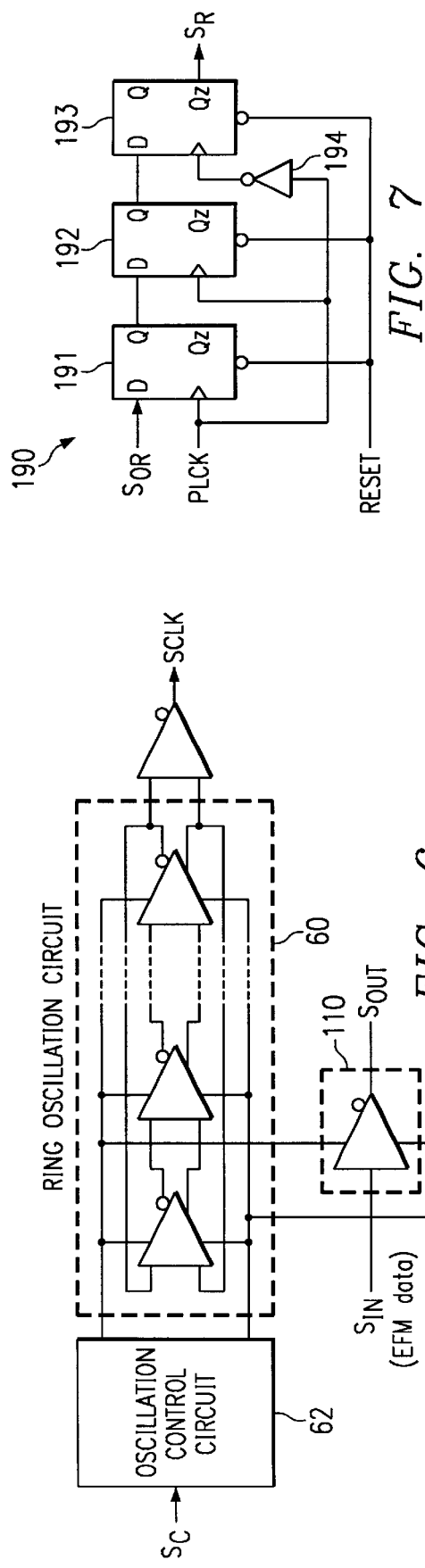
FIG. 6 is a circuit diagram showing the VCO and the configurations of the delay buffer contained in the phase comparison circuit in FIG. 5.

FIG. 6 is a circuit diagram showing an example of the configurations of the VCO (60) and the delay buffer (110). As shown in the figure, the VCO (60) of the present example is a ring oscillation circuit having the configuration an odd number of inverter stages connected in series. The delay buffer (110) is configured with a single stage buffer.

The delay time of each stage of the inverters and the buffer contained in the VCO (60) and the delay buffer (110) is controlled according to the control signal from an oscillation control circuit (62). Furthermore, the oscillation control circuit (62), for example, controls the voltage level of the output control signal according to the control signal ($S_C$). Delay time of the respective inverters contained in the VCO (60) and the buffer contained in the delay buffer (110) is controlled according to the voltage level of said control signal. For example, the control signal ($S_C$) supplied to the oscillation control circuit (62) is the output signal of the low-pass filter (30) in the PLL circuit shown in FIG. 1, and said control signal ($S_C$) is set according to the output signals from the phase comparison circuit (10) and the frequency comparison circuit (20).

Accordingly, because the delay time of the respective stage in the odd number of inverters contained in the VCO (60) is set according to the result of the comparison by the phase comparison circuit (10) or the frequency comparison circuit (20), the clock signal (SCLK) generated by the VCO (60) and the oscillation frequency and the phase of the clock signal (PLCK) generated based on said signal, are set to specific values, respectively. Similarly, the delay time of the delay buffer (110) is controlled according to the output signals from the phase comparison circuit (10) and the frequency comparison circuit (20).

Figure 7:
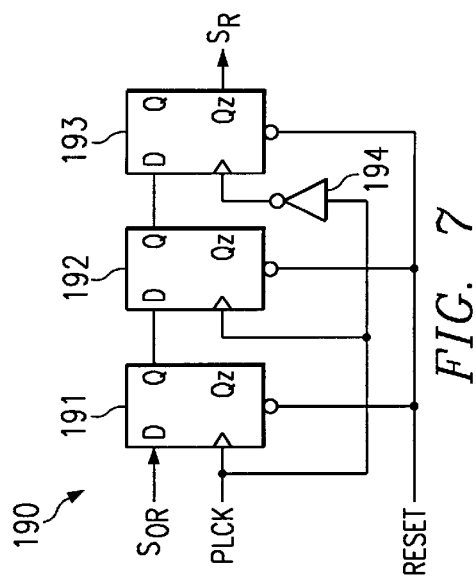
FIG. 7 is a circuit diagram showing the configuration of the shift register contained in the phase comparison circuit in FIG. 5.

FIG. 7 is a circuit diagram showing an example of the configuration of the shift register (190). As shown in the figure, the shift register (190) of the present example contains D flip-flops (191), (192), and (193) and an inverter (194).

The flip-flops (191), (192), and (193) are connected in series. Output signal ($S_{OR}$) of the OR gate (180) shown in FIG. 5 is connected to the input terminal of the D flip-flop (191), and the clock signal (PLCK) is connected to the clock input terminal. Input terminal of the D flip-flop (192) is connected to the output terminal (Q) of the D flip-flop (191), and the clock signal (PLCK) is connected to the clock input terminal. Input terminal of the D flip-flop (193) is connected to the output terminal (Q) of the D flip-flop (192), and output signal of the inverter (194), which is the inverted signal of the clock signal (PLCK), is connected to the clock input terminal. Output signal ($S_R$) from the inverted output terminal ($Q_Z$) of the D flip-flop (193) is supplied as a D flip-flop reset signal for the D flip-flops (124) and (134), which are contained in the leading edge detection circuit (120) and the falling edge detection circuit (130).

Because the D flip-flops (124) and (134), which are contained in the leading edge detection circuit (120) and the falling edge detection circuit (130), are reset at the beginning of the operation, the leading edge detection signal ($S_{E1}$) and the falling edge detection signal ($S_{E2}$) are both held low. When either a leading edge or a falling edge of the input signal ($S_{IN}$) is detected, either the leading edge detection signal ($S_{E1}$) or the falling, edge detection signal ($S_{E2}$) is switched from low to high. In response, output signal ($S_{OR}$) from the OR gate (180) is also switched from low to high.

After the input signal ($S_{OR}$) becomes high in the shift register (190), output signal of the D flip-flop (191) rises at a leading edge of the clock signal (PLCK), and then the output signal of the D flip-flop (192) also rises at the next leading edge of the clock signal (PLCK). Furthermore, as the output signal of the inverter (194) rises at a falling edge of the clock signal (PLCK), output signal of the D flip-flop (193) rises accordingly, and output signal of the inverted output terminal ($Q_Z$) falls at the same time.

As described above, after the output signal ($S_{OR}$) of the OR gate (180) has risen, and a delay of roughly 1.5T is added by the shift register (190), the output signal ($S_R$) is switched from high to low. Here, T corresponds to the period of the clock signal (PLCK). Delay time of the shift register (190) can be adjusted by changing the number of stages of D flip-flops contained in the shift register (190).

Once the output signal ($S_R$) of the shift register (190) is set to low, the D flip-flops (124) and (134) of the leading edge detection circuit (120) and the falling edge detection circuit (130) are reset, so that the output signal ($S_{OR}$) of the OR gate (180) is switched to low. In response, the D flip-flops (191), (192), and (193), contained in the shift register (190), are each reset to their initial state respectively.

In the phase comparison circuit (100) shown in FIG. 5, the phase detection circuit (150-1) contains D flip-flops (151) and (152) and a NAND gate (153). Input terminal (D) of the D flip-flop (151) is connected to the source voltage ($V_{CC}$). Output signal ($S_{D1}$) from the delay buffer (110) is connected to the clock input terminal. Input terminal (D) of the D flip-flop (152) is also connected to the source voltage ($V_{CC}$), and the clock signal (PLCK) is connected to the clock input terminal.

The NAND gate (153) is a 3-input NAND gate; wherein, leading edge detection signal ($S_{E1}$) from the leading edge detection circuit (120) is connected to one of the input terminals, and output signals of the D flip-flops (151) and (152) are connected to the other 2 input terminals, respectively. Output signal ($S_{R1}$) of the NAND gate (153) is supplied as a reset signal to the D flip-flops (151) and (152).

In their initial state, the D flip-flops (151) and (152) are reset, and the output signals (Q) are both held low. Output signal of the D flip-flop (151) rises at a leading edge of the output signal ($S_{D1}$) of the delay buffer (110). Also, output signal of the D flip-flop (152) rises at a leading edge of the clock signal (PLCK). At this time, if the leading edge detection signal ($S_{E1}$) from the leading edge detection circuit (120) is high, output signal ($S_{R1}$) of the NAND gate (153) switches from high to low. In response, the D flip-flops (151) and (152) are reset, and the output signal is set low.

As shown in FIG. 5, the phase detection circuit (150-2) is configured with an inverter (154), D flip-flops (155) and (156), and a NAND gate (157). Input terminal (D) of the D flip-flop (155) is connected to the source voltage ($V_{CC}$). Output signal of the inverter (154), that is, inverted signal of the output signal ($S_{D1}$) of the delay buffer (110), is to the clock input terminal. Input terminal (D) of the D flip-flop (156) is also connected to the source voltage ($V_{CC}$), and the clock signal (PLCK) is connected to the clock input terminal.

The NAND gate (157) is a 3-input NAND gate; wherein, edge detection signal ($S_{E2}$) of the falling edge detection circuit (130) is connected to one of the input terminals, and output signals of the D flip-flops (155) and (156) are connected to the other 2 input terminals, respectively. Output signal ($S_{R2}$) of the NAND gate (157) is supplied as a reset signal to the D flip-flops (155) and (156).

While in the initial state, the D flip-flops (155) and (156) are reset, and the output signals (Q) are both held low. Output signal of the D flip-flop (155) rises at a falling edge of the output signal ($S_{D1}$) of the delay buffer (110), that is, at a leading edge of the output signal of the inverter (154). Also, output signal of the D flip-flop (156) rises at a leading edge of the clock signal (PLCK). At this time, if the leading edge detection signal ($S_{E2}$) from the falling edge detection circuit (130) is held high, output signal ($S_{R2}$) of the NAND gate (157) switches from high to low. In response, the D flip-flops (155) and (156) are reset, and the output signal is set to low.

Output signals of the D flip-flops (151) and (155) are connected to the OR gate (161) of the charge pump circuit (160), and output signals of the D flip-flops (152) and (156) are connected to the OR gate (162) of the charge pump circuit (160). The charge pump circuit (160) outputs the phase difference signal (PDO) according to the input signals from the phase detection circuits (150-1) and (150-2).

As shown in the figure, in the charge pump circuit (160), output signals from the OR gate (161) and the OR gate (162) are both input into a simultaneous switch prevention circuit (163), and the simultaneous switch prevention circuit (163) controls the timing of the signals from the OR gates (161) and (162) in order to prevent a pMOS transistor (164) and an nMOS transistor (165) from being turned on simultaneously.

When the leading edge of the delayed signal ($S_{D1}$) from the delay buffer (110) is ahead of the leading edge of the clock signal (PLCK), for example, a pulse is output from the D flip-flop (151) by the phase detection circuit (150-1) corresponding to the phase difference between the signals. In the charge pump circuit (160), the pMOS transistor (164) is switched ON at a timing- corresponding to said pulse, and the error signal (PDO) is held high, for example, at the source voltage ($V_{CC}$), in the meantime.

In addition, in the same manner as that described above, when the falling edge of the delayed signal ($S_{D1}$) from the delay buffer (110) is ahead of the leading edge of the clock signal (PLCK), for example, a pulse is output from the D flip-flop (155) by the phase detection circuit (150-2) corresponding to the phase difference between the signals. In the charge pump circuit (160), the pMOS transistor (164) is switched ON at a timing corresponding to said pulse, and the error signal (PDO) is held high.

On the contrary, when the leading edge of the delayed signal ($S_{D1}$) from the delay buffer (110) is behind the leading edge of the clock signal (PLCK), a pulse is output from the D flip-flop (152) corresponding to the phase difference between the signals. In the charge pump circuit (160), the nMOS transistor (165) is turned ON at a timing corresponding to said pulse, and the error signal (PDO) is held low, for example, at the ground potential (GND), in the meantime.

Also, when the falling edge of the delayed signal ($S_{D1}$) from the delay buffer (110) is behind the leading edge of the clock signal (PLCK), a pulse is output from the D flip-flop (156) corresponding to the phase difference between the signals. In the charge pump circuit (160), the nMOS transistor (165) is switched ON at a timing corresponding to said pulse, and the error signal (PDO) is held low in the meantime.

Because the pMOS transistor (164) and the nMOS transistor (165) are both OFF in the charge pump circuit (160) when the error signal (PDO) is neither high nor low, output terminal for the error signal (PDO) is held at a high-impedance state.

Figure 8:
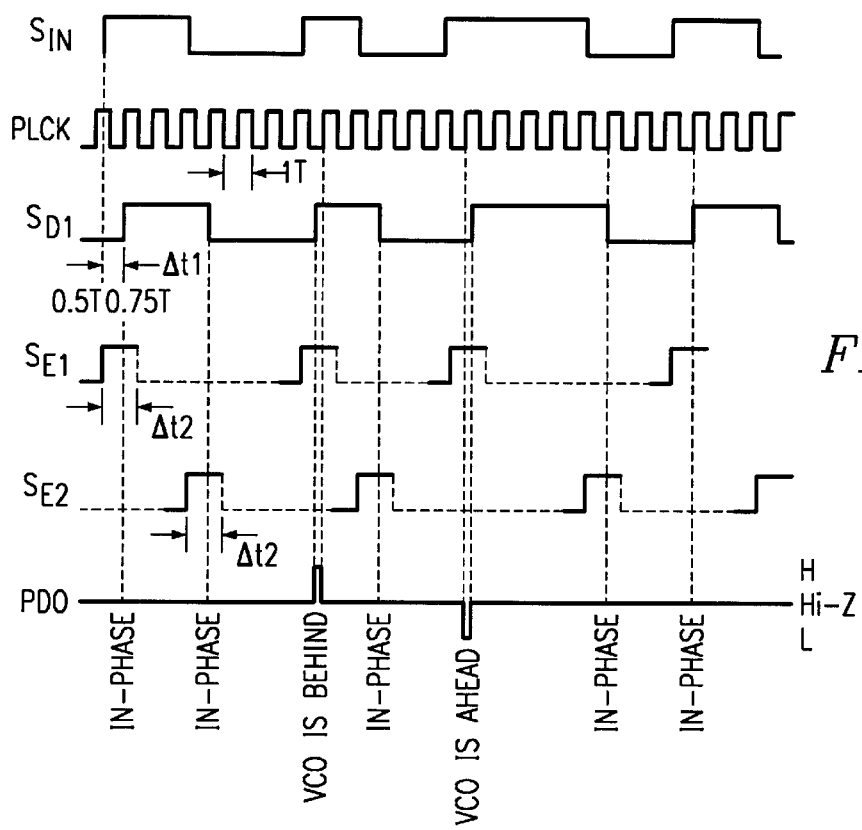
FIG. 8 is a waveform diagram showing the operation of the phase comparison circuit in FIG. 5.

FIG. 8 is a diagram showing the waveform of the phase comparison circuit (100) during its operation. Operation of the phase comparison circuit (100) of the present example will be explained below in reference to FIGS. 8 and 5.

As shown in FIG. 8, delayed signal ($S_{D1}$) which is delayed from the input signal ($S_{IN}$) by the delay time ($\Delta t1$) of the delay buffer (110) is output. Also, the leading edge detection circuit (120) and the falling edge detection circuit (130) generate pulse signals with the width of $\Delta t2$, that is, edge detection signals ($S_{E1}$) and ($S_{E2}$), at the leading edge and the falling edge of the input signal ($S_{IN}$), respectively.

The leading edge of the delayed signal ($S_{D1}$) and the leading edge of the clock signal (PLCK) are compared in the phase detection circuit (150-1), and the falling edge of the delayed signal ($S_{D1}$) and the leading edge of the clock signal (PLCK) from the VCO are compared in the phase detection circuit (150-2). Because a pulse signal corresponding to the phase difference between the compared signals is generated according to the comparison result and supplied to the charge pump circuit (160), the charge pump circuit (160) outputs an error signal (PDO) having either a positive or a negative pulse signal with the width corresponding to the phase difference.

For example, when the phase of the delayed signal ($S_{D1}$) is ahead of the clock signal (PLCK), that is, when the phase of the clock signal (PLCK) is behind, the charge pump circuit (160) outputs a positive pulse. The width of said positive pulse corresponds to the phase difference between the delayed signal ($S_{D1}$) and the clock signal (PLCK)

On the contrary, when the phase of the delayed signal ($S_{D1}$) is behind the clock signal (PLCK), that is, when the phase of the clock signal (PLCK) is ahead, the charge pump circuit (160) outputs a negative pulse. The width of said positive pulse corresponds to the phase difference between the delayed signal ($S_{D1}$) and the clock signal (PLCK)

When the delayed signal ($S_{D1}$) and the clock signal (PLCK) are synchronous, no error signal (PDO) is output, and [the output] is held at a high-impedance state.

When applying the phase comparison circuit (100) of the present example to the PLL circuit shown in FIG. 1, unlike in the case of the conventional phase comparison circuit (10) shown in FIG. 3, the pulse width of the error signal (PDO) corresponds to the phase difference, and the advancement or the delay of the phase is represented by the polarity of the pulse. Furthermore, when there is no phase difference, because there is no pulse output in the error signal (PDO), and [the comparison circuit] is held at a high-impedance state, the error signal (PDO) can be used directly to control the oscillation frequency of the VCO. As a result, response of the PLL circuit speeds up without requiring the integration circuit of the conventional PLL circuit. Thus, a high-speed response characteristic compatible with the high-speed data reproduction for a CD or a DVD reproduction device can be achieved.

Second Embodiment of Phase Comparison Circuit

Figure 9:
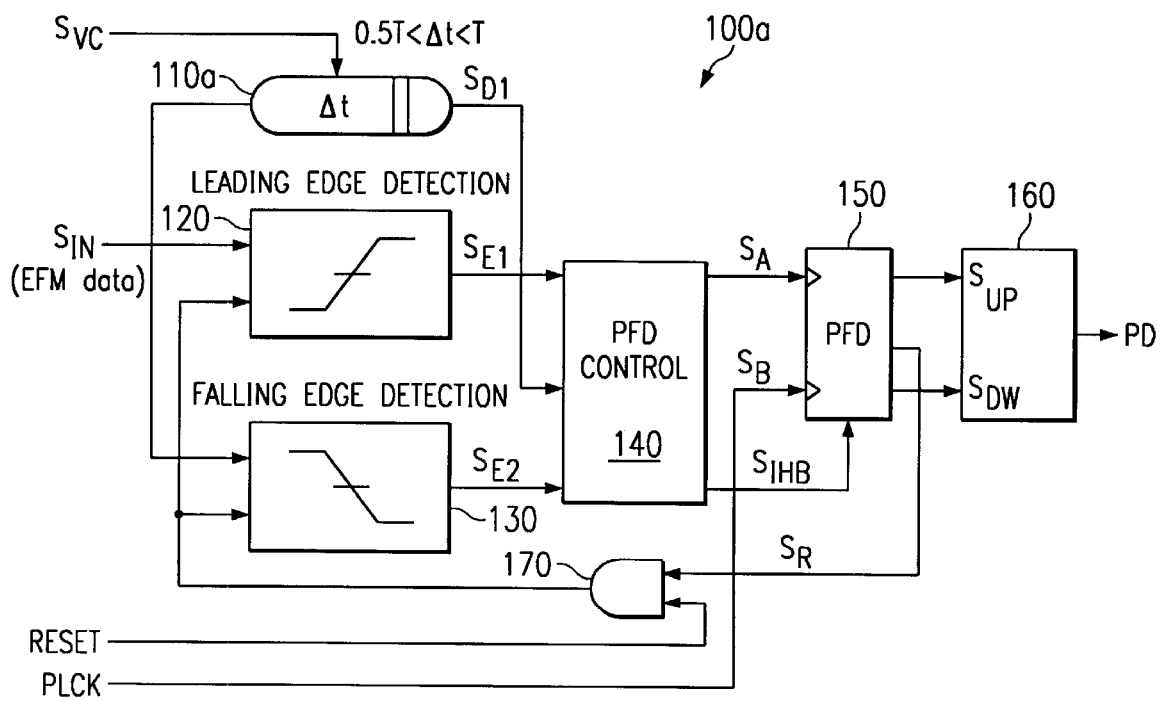
FIG. 9 is a block diagram showing a second embodiment of the phase comparison circuit of the present invention.

FIG. 9 is a block diagram showing the concept of another phase comparison circuit (100a) of the present invention. As shown in the figure, said phase comparison circuit (100a) contains a delay buffer (110), a leading edge detection circuit (120), a falling edge detection circuit (130), a phase detection control circuit (PFD Control) (140), a phase detection circuit (PHD) (150), a charge pump circuit (160), and an AND gate (170).

The delay buffer (110) adds a delay time ($\Delta t$) to the input signal ($S_{IN}$) according to the input of a voltage control signal ($S_{VC}$). The voltage control signal ($S_{VC}$) is identical, for example, to the signal for controlling the oscillation frequency of the VCO. The delay buffer (110) adds a delay time ($\Delta t$) to the input signal ($S_{IN}$) and outputs a delayed signal ($S_{D1}$)

The leading edge detection circuit (120) detects the leading edge of the input signal ($S_{IN}$) and outputs an edge detection signal ($S_{E1}$). The falling edge detection circuit (130) detects the falling edge of the input signal ($S_{IN}$) and outputs an edge detection signal ($S_{E2}$).

Upon receiving the delayed signal ($S_{D1}$) from the delay buffer (110), the edge detection signal ($S_{E1}$) from the leading edge detection circuit (120), and the edge detection signal ($S_{E2}$) from the falling edge detection circuit (130), the phase detection control circuit (140) generates a phase detection control signal ($S_A$) and this signal is input into the phase detection circuit (150). Furthermore, the phase detection control circuit (140) generates an inhibition signal ($S_{IHB}$) according to the input signal and inputs it into the phase detection circuit (150).

The phase detection circuit (150) takes the input of the control signal ($S_A$) and the inhibition signal ($S_{IHB}$) from the phase detection control circuit (140) and further takes the input of the clock signal (PLCK) as a control signal ($S_B$) in order to generate an up signal ($S_{UP}$), a down signal ($S_{DW}$), and a reset signal ($S_R$) according to these input signals. The up signal ($S_{UP}$) and the down signal ($S_{DW}$) are supplied to the charge pump circuit (160), and the reset signal ($S_R$) is input to the AND gate (170) along with the system reset signal (RESET) from the outside. Output signal of the AND gate (170) is supplied to the leading edge detection circuit (120) and the falling edge detection circuit (130) as the reset signal.

Upon receiving the up signal ($S_{UP}$) and the down signal ($S_{DW}$) from the phase detection circuit (150), the charge pump circuit (160) controls the error signal (PDO) to be output according to these signals. For example, while the up signal ($S_{UP}$) is being held to the high level, the error signal (PDO) is set to the high level; and, on the contrary, while the down signal ($S_{DW}$) is high, the error signal (PDO) is set to low. When the up signal ($S_{UP}$) and the down signal ($S_{DW}$) are both low, the error signal (PDO) is set to the high-impedance state.

Figure 10:
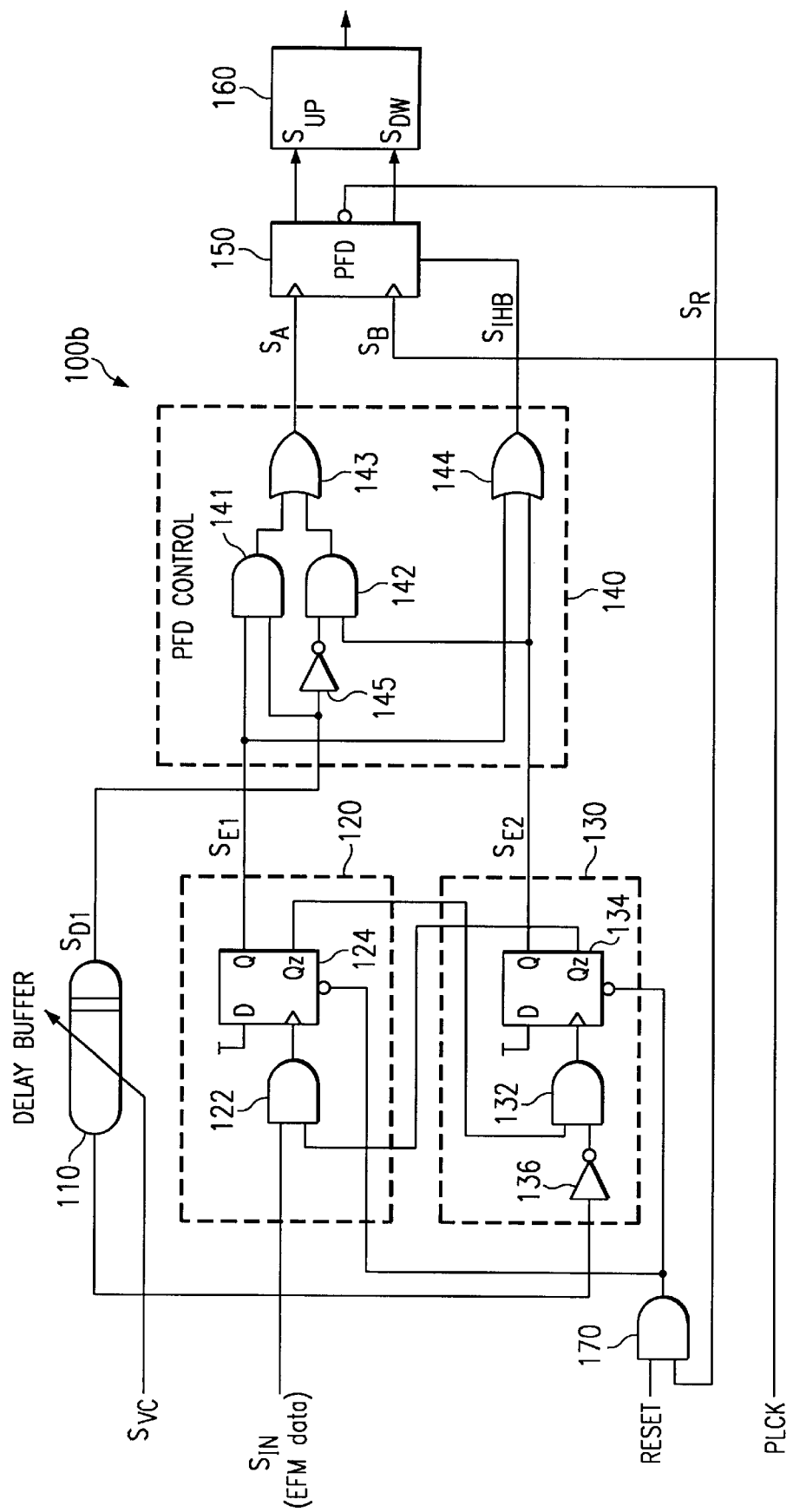
FIG. 10 is a circuit diagram showing the specific configuration of the second embodiment of the phase comparison circuit.

FIG. 10 shows a specific circuit configuration of the phase comparison circuit. As shown in the figure, the phase comparison circuit (100b) of the present example contains a delay buffer (110), a leading edge detection circuit (120), a falling edge detection circuit (130), a phase comparison control circuit (140), a phase detection circuit (150), a charge pump circuit (160), and an AND gate (170).

As shown in the figure, the leading edge detection circuit (120) contains an AND gate (122) and a D flip-flop (124). The falling edge detection circuit (130) contains an AND gate (132), a D flip-flop (134), and an inverter (136).

At the leading edge detection circuit (120), input signal ($S_{IN}$) is input to one of the input terminals of the AND gate (122), and output signal from the inverted output terminal ($Q_Z$) of the D flip-flop (134), which is contained in the falling edge detection circuit (130), is input to the other input terminal. At the falling edge detection circuit (130), output signal of the inverter (136), that is, the inverted signal of the input signal ($S_{IN}$), is connected to one of the input terminals of the AND gate (132), and the output signal from the inverted output terminal ($Q_Z$) of the D flip-flop (124), which is contained in the leading edge detection circuit (120), is connected to the other input terminal. The input signal ($S_{IN}$) is connected to the input terminal of the inverter (136).

Output signal from the output terminal (Q) of the D flip-flop (124) and output signal from the output terminal (Q) of the D flip-flop (134) are output to the phase comparison control circuit (140) as a leading edge detection signal ($S_{E1}$) and as a falling edge detection signal ($S_{E2}$), respectively.

The phase comparison control circuit (140) contains AND gates (141) and (142), OR gates (143) and (144), and an inverter (145). The delayed signal ($S_{D1}$) from the delay buffer (110) and the leading edge detection signal ($S_{E1}$) from the leading edge detection circuit (120) are connected to the input terminals of the AND gate (141), and output signal from the inverter (145), that is, inverted signal of the delayed signal ($S_{D1}$), and the falling edge detection signal ($S_{E2}$) from the falling edge detection circuit (130) are connected to the input terminal of the AND gate (142).

Output signals from the AND gates (141) and (142) are input into the OR gate (143), and output signal from the OR gate (143) is supplied to the phase detection circuit (150) as a phase detection control signal ($S_{E1}$). Also, the leading edge detection signal ($S_{E1}$) and the falling edge detection signal ($S_{E2}$) are connected to the OR gate (144), and output signal ($S_{IHB}$) of the OR gate (144) is supplied to the phase detection circuit (150) as an inhibition signal.

The leading edge of the input signal ($S_{IN}$) is detected by the leading edge detection circuit (120), and a leading edge detection signal ($S_{E1}$) having a specific width is output according to the leading edge. Similarly, the falling edge of the input signal ($S_{IN}$) is detected by the falling edge detection circuit (130), and a falling edge detection signal ($S_{E2}$) having a specific width is output according to the falling edge.

System reset signal (RESET) is input into one of the input terminals, of the AND gate (170), and reset signal ($S_R$) from the phase detection circuit (150) is input into the other input terminal. The output signal from the AND gate (170) is supplied to the leading edge detection circuit (120) and the falling edge detection circuit (130) in order to reset the D flip-flops (124) and (134) which are contained in the edge detection circuits.

At the phase detection control circuit (140), when the delayed signal ($S_{D1}$) from the delay buffer (110) rises while the leading edge detection signal ($S_{E1}$) is high, output signal of the AND gate (141) rises, and output signal ($S_A$) of the OR gate (143) rises accordingly.

Similarly, when the delayed signal ($S_{D2}$) from the delay buffer (110) falls while the falling edge detection signal ($S_{E2}$) is high, output signal of the AND gate (142) rises, and output signal ($S_A$) of the OR gate (143) rises accordingly.

In other words, the phase detection control signal ($S_A$) is output by the phase detection control circuit (140) in response either to the leading edge or to the falling edge of the input signal ($S_{IN}$). In addition, the inhibition signal ($S_{IHB}$) is output according to the leading edge detection signal ($S_{E1}$) and the falling edge detection signal ($S_{E2}$).

Figure 11:
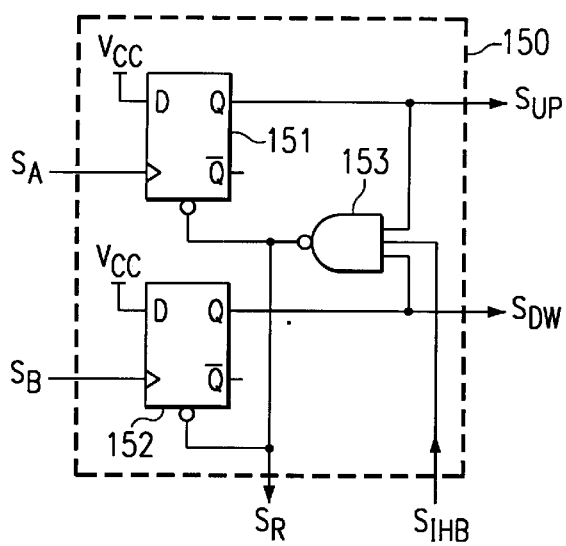
FIG. 11 is a circuit diagram showing the configuration of the phase detection circuit contained in the phase comparison circuit in FIG. 10.

FIG. 11 is a circuit diagram showing an example of the configuration of the phase detection circuit (150). As shown in the figure, the phase detection circuit (150) contains D flip-flops (151) and (152) and a NAND gate (153).

Input terminal (D) of the D flip-flop (151) is connected to the source voltage ($V_{CC}$), and clock input terminal is connected to the input terminal for control signal ($S_A$). Up signal ($S_{UP}$) is output from the output terminal (Q) of the D flip-flop (151). Input terminal (D) of the D flip-flop (152) is connected to the source voltage ($V_{CC}$), and clock input terminal is connected to the input terminal for control signal ($S_B$). Down signal ($S_{DW}$) is output from the output terminal (Q) of the D flip-flop (152).

Furthermore, as described above, the clock signal (PLCK) serves as the control signal ($S_B$).

The NAND gate (153) is a 3-input NAND gate; wherein, the up signal ($S_{UP}$), the down signal ($S_{DW}$), and the inhibition signal ($S_{IHB}$) starting with phase detection control circuit (150) are input into the 3 input terminals, respectively. Output signal ($S_R$) from the NAND gate (153) is supplied as a reset signal to the D flip-flops (151) and (152), respectively, and is further supplied to the NAND gate (170) shown in FIG. 10.

Figure 12:
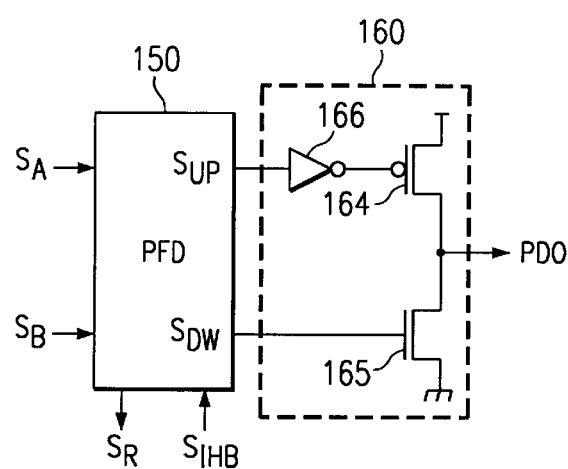
FIG. 12 is a circuit diagram showing the configurations of the phase detection circuit and the charge pump circuit.

FIG. 12 is a circuit diagram showing the configurations of the phase detection circuit (150) and the charge pump (160). As shown in the figure, the charge pump (160) contains a pMOS transistor (164), an nMOS transistor (165), and an inverter (166).

Up signal ($S_{UP}$) from the phase detection circuit (150) is connected to the input terminal of the inverter (166). The pMOS transistor (164) and the nMOS transistor (165) are connected in series between the source voltage ($V_{CC}$) and the ground potential (GND). Gate of the pMOS transistor (164) is connected to the output terminal of the inverter (166), the source is connected to the source voltage ($V_{CC}$), the drain is connected to the drain of the nMOS transistor (165), and said junction forms the output terminal for the error signal (PDO). The down signal ($S_{DW}$) from the phase detection circuit (150) is connected to the gate of the nMOS transistor (165), and the source of the nMOS transistor (165) is grounded.

The output signal ($S_A$) is switched from low to high by the phase detection control circuit (140) according to the leading edge or the falling edge of the output signal ($S_{D1}$) from the delay buffer (110). At the phase detection circuit (150), phase of the leading edge of the output signal ($S_A$) and the phase of the control signal ($S_B$), that is, the clock signal (PLCK), are detected, and the up signal ($S_{UP}$) or the down signal ($S_{DW}$) is output according to the phase difference.

Figure 13:
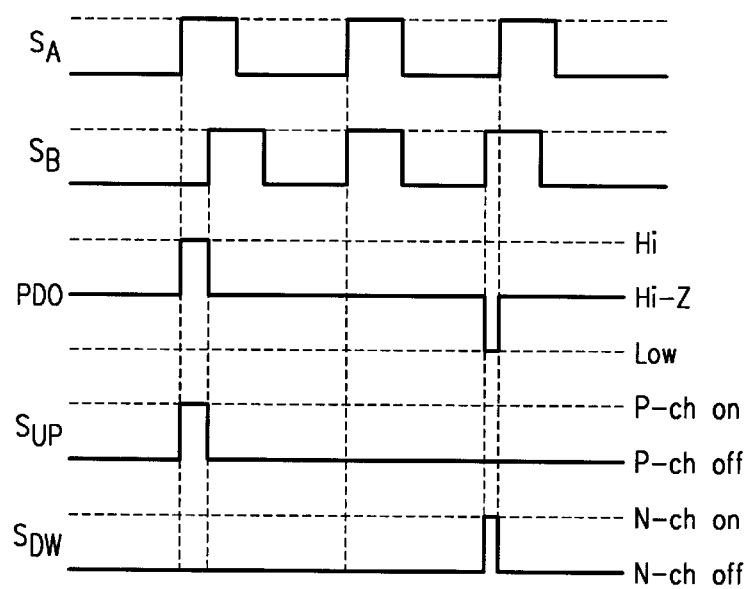
FIG. 13 is a waveform diagram showing the operations of the phase detection circuit and the charge pump circuit.

FIG. 13 shows the waveforms of the control signals ($S_A$) and ($S_B$), the up signal ($S_{UP}$), and the down signal ($S_{DW}$) at the phase detection circuit (150) and the charge pump circuit (160) as well as the error signal (PDO) which is the output signal of the charge pump circuit (160). Operations of the phase detection circuit (150) and the charge pump circuit (160) will be explained below in reference to FIG. 13.

When the control signal ($S_A$) is ahead of the control signal ($S_B$), a positive pulse is generated for the up signal ($S_{UP}$) according to the phase difference. When the up signal ($S_{UP}$) is high, the pMOS transistor (164) of the charge pump circuit (160) is turned ON, and the error signal (PDO) is set, for example, to the source voltage ($V_{CC}$).

When the control signal ($S_A$) is behind the control signal ($S_B$), a positive pulse is generated for the down signal ($S_{DW}$) according to the phase difference. When the down signal ($S_{DW}$) is high, the nMOS transistor (165) of the charge pump circuit (160) is turned ON, and the error signal (PDO) is set, for example, to the ground potential (GND).

When the control signals ($S_A$) and the control signals ($S_B$) are synchronous, the D flip-flops (151) and (152) are in the reset state at the phase detection circuit (150), and the up signal ($S_{UP}$) and the down signal ($S_{DW}$) are both set to low. Because the pMOS transistor (164) and the nMOS transistor (165) are both turned OFF accordingly at the charge pump (160), the output terminal for the error signal (PDD) is set to the high-impedance state.

Figure 14:
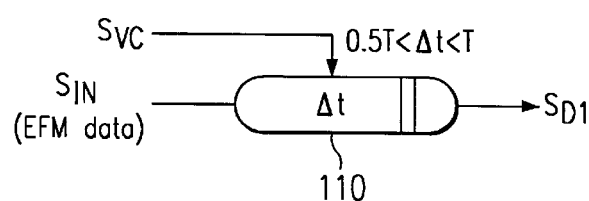
FIG. 14 is a diagram showing the input/output signals and the delay time (Δt) of the delay buffer.

FIG. 14 shows the input/output signals of the delay buffer (110) and the delay time ($\Delta t$). As shown in the figure, control signal ($S_{VC}$) for controlling the delay time into ($\Delta t$) is input into the delay buffer (110), and delay time ($\Delta t$) of the delay buffer (110) is controlled according to the voltage level of said control signal $S_{VC}$) such that the delay time ($\Delta t$) is within the range ($0.5T < \Delta t < T$).

Input signal ($S_{IN}$) of the delay buffer (110) comprises, for example, EFM data obtained by means of an optical detection circuit. Said input signal ($S_{IN}$) is delayed by the delay time ($\Delta t$), and delayed signal ($S_{D1}$) is output.

Figure 15:
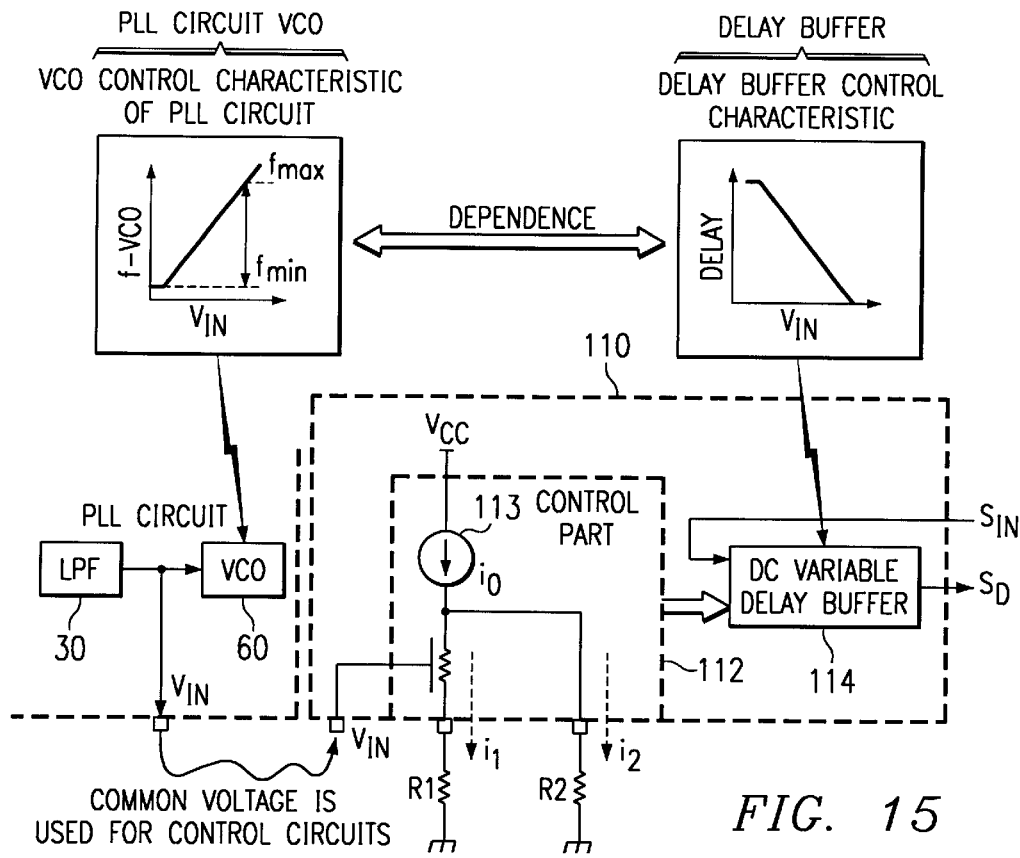
FIG. 15 is a diagram showing the control characteristics of the VCO and the delay buffer.

FIG. 15 is a diagram showing the control characteristic of the VCO of the PLL circuit and the control characteristic of the delay buffer.

As shown in the figure, the VCO (60) and the delay buffer (110) of the PLL circuit are controlled by means of the same control signal ($V_{in}$). Oscillation frequency of the VCO (60) is controlled according to the control signal ($V_{in}$) input. Here, oscillation frequency of the VCO (60) is controlled so that it is, for example, within the range between fmin and fmax. On the other hand, delay time ($\Delta t$) is controlled by the same control signal ($V_{in}$) at the delay buffer (110). Assuming that the cycle of the oscillation frequency of the VCO (60) is T, delay time ($\Delta t$) of the delay buffer (110) is controlled to stay within the range of 0.5T–T.

At the PLL circuit, control signal ($V_{in}$) ($S_C$) for controlling the oscillation frequency of the VCO (60) is generated by means of a low-pass filter (LPF). Said control signal ($V_{in}$) is not only output to the VCO (60), but also output outside of the PLL circuit block and sent to the delay buffer (110).

As shown in the figure, the delay buffer (110) is configured with a control part (112) and a delay part (114). At the control part (112), delay control current ($I_0$), generated by a current source (113) is divided into currents ($I_1$) and ($I_2$). The current ($I_1$) is set according to the control signal ($V_{in}$). The current ($I_2$) is a current used to regulate the maximum delay time ($\Delta t$ max) of the delay buffer (110).

The delay part (114) adds a delay time ($\Delta t$) to the input signal ($S_{IN}$) according to the delay time ($\Delta t$) set by the control part (112) in order to obtain the delayed signal ($S_{D1}$).

As described above, in the present invention, the control characteristics of the VCO and the delay buffer of the PLL circuit depend on each other, and these circuits are controlled using the same control signal, oscillation frequency (f-VCO) and, delay time ($\Delta t$) of the delay buffer have characteristics that change with respect to each other. That is, when the oscillation frequency of the VCO is set high, the delay time of the delay buffer is set small accordingly; and, on the contrary, when the oscillation frequency of the VCO is set low, the delay time of the delay buffer is set large. As a result, the PLL circuit can regenerate clock signal (PLCK) synchronous with the input signal, for example, EFM data, under different operating frequencies.

Figure 16:
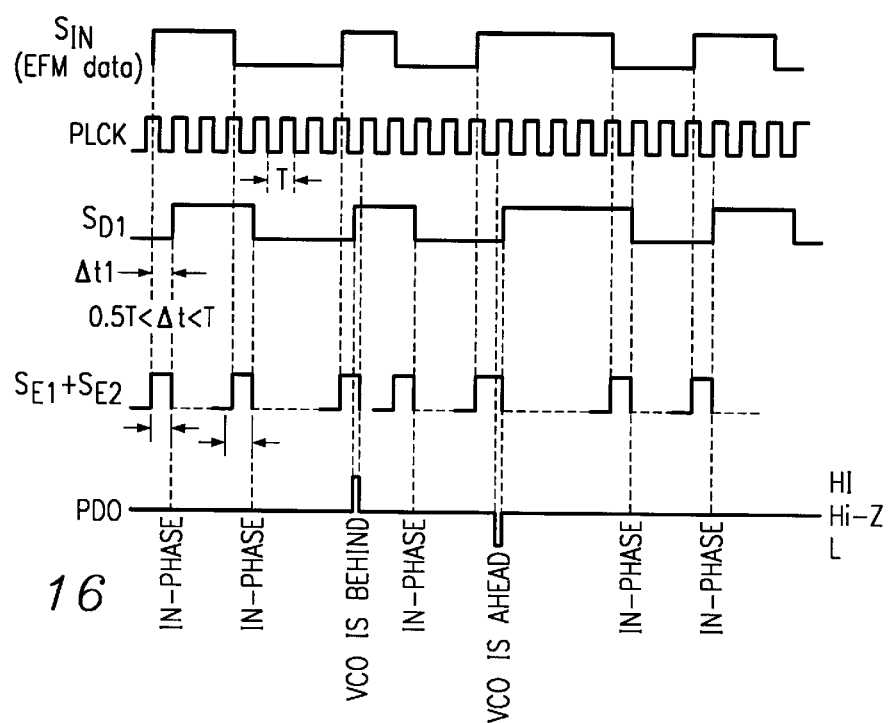
FIG. 16 is a waveform diagram showing the operation of the phase comparison circuit shown in FIG. 10.

FIG. 16 shows the waveforms when the phase comparison circuits (100a) and (100b) shown in FIGS. 9 and 10 are operating. Operation of the phase comparison circuit of the present example will be explained below in reference to these circuit diagrams and the waveform diagram.

As shown in FIG. 16, a leading edge detection signal ($S_{E1}$) and a falling edge detection signal ($S_{E2}$) are output according to the leading edge and the falling edge of the input signal ($S_{IN}$), respectively. Furthermore, an output signal ($S_{D1}$), for which the input signal ($S_{IN}$) is delayed by the time ($\Delta t$), is output by the delay buffer (110).

A clock signal (PLCK) having the cycle of T is generated based on the output signal (SCLK) of the VCO. At the phase detection circuit (150), phases of the delayed signal ($S_{D1}$) from the delay buffer (110) and the clock signal (PLCK) are compared. Either the up signal ($S_{UP}$) or the down signal ($S_{DW}$) is generated to control the charge pump circuit (160) according to the comparison result, and the charge pump circuit (160) operates according to these signals in order to control the level of the error signal (PDO).

For example, when the phase of the clock signal (PLCK) is behind the delayed signal ($S_{D1}$), a positive pulse is output for the error signal (PDO) according to the phase difference between these signals. On the contrary, when the phase of the clock signal (PLCK) is ahead of the delayed signal ($S_{D1}$), a negative pulse is output for the error signal (PDO) according to the phase difference between these signals. When the clock signal (PLCK) and the delayed signal ($S_{D1}$) are synchronous, the error signal (PDO) is held at a high-impedance state.

After the high-frequency components are removed by the low-pass filter, the error signal (PDO) generated in the aforementioned manner is supplied as a control signal to the VCO and the delay buffer, respectively, in order to control the oscillation frequency (f-VOC) of the VCO and the delay time ($\Delta t$) of the delay buffer. Furthermore, the level of the error signal (PDO) is set according to the phase difference of the signals to be compared; and because the error signal (PDO) is held at a high-impedance state when there is no phase difference between the signals to be compared, that is, the signals to be compared are synchronous, there is no need to integrate the error signal (PDO) in order to control the oscillation frequency of the VCO by means of the integrated signal. Thus, response of the PLL circuit speeds up, and high-speed regeneration of signals for a CD and a DVD can be managed.

As described above, in the phase comparison circuit of the present embodiment, the input signal is delayed by the delay buffer in order to output the delayed signal. Changes in the level of the input signal are detected by the leading edge detection circuit and the falling edge detection circuit in order to output the first and the second edge detection signals, the control circuit changes the level of the output signal according to these edge detection signals, the phase detection circuit compares the phases of the output signal from the control circuit and the clock signal in order to output first and second control signals corresponding to the comparison result. Because the charge pump circuit not only outputs phase difference signal corresponding to the phase difference between the aforementioned delayed signal and the clock signal according to the first and the second control signals from the phase comparison circuit but also holds the phase difference signal to a high-impedance state when the aforementioned delayed signal and the clock signal are synchronous, the oscillation frequency of the voltage control oscillation circuit can be controlled according to the phase difference signal, and high-speed regeneration of the signals can be achieved due to the good response characteristic of the PLL circuit when generating the aforementioned clock signal.

As it has been described above, the phase comparison circuit of the present invention has an advantage that the response characteristic of the PLL circuit can be improved, and high-speed signal response can be achieved.

Furthermore, when a PLL circuit is configured using the phase comparison circuit of the present invention, high-speed reproduction of signals for a CD or a DVD can be realized.

What is claimed is:

1. Phase comparison circuit having a single voltage-controlled delay circuit that adds a prescribed delay time to an input signal of either a first or a second level in order to output a delayed signal, a first edge detection circuit that outputs a first edge detection signal upon detecting the changing edge at which the input signal changes from the first level to the second level, a second edge detection circuit that outputs a second edge detection signal upon detecting the changing edge at which the input signal changes from the second level to the first level, a phase detection circuit that outputs a first control signal by comparing the phase of the delayed signal and the phase of a clock signal when the first detection signal is output and outputs a second control signal by comparing the phase of the delayed signal and the phase of a clock signal when the second detection signal is output, and an output circuit that outputs a phase difference signal indicating the phase difference between the delayed signal and the clock signal according to the first and the second control signals.

2. Phase comparison circuit of claim 1 wherein the frequency of the clock signal is controlled according to the phase difference signal.

3. Phase comparison circuit of claim 1, which includes a reset circuit to reset the first or second edge detection signal to the initial state after a prescribed amount of time has elapsed when the first or second edge detection signal is output.

4. Phase comparison circuit of claim 1, in which the phase difference signal is held at a first level corresponding to the first control signal and at a second level corresponding to the second control signal.

5. Phase comparison circuit of claim 4, in which the phase difference signal enters a high-impedance state when the delayed signal and the clock signal are synchronous.

6. Phase comparison circuit having a delay circuit that adds a prescribed delay time to an input signal of either a first or a second level in order to output a delayed signal, a first edge detection circuit that outputs a first edge detection signal upon detecting the changing edge at which the input signal changes from the first level to the second level, a second edge detection circuit that outputs a second edge detection signal upon detecting the changing edge at which the input signal changes from the second level to the first level, a phase detection circuit that outputs a first control signal by comparing the phase of the delayed signal and the phase of a clock signal when the first detection signal is output and outputs a second control signal by comparing the phase of the delayed signal and the phase of a clock signal when the second detection signal is output, and an output circuit that outputs a phase difference signal indicating the phase difference between the delayed signal and the clock signal according to the first and the second control signals; and wherein the delay time is controlled according to the phase difference signal.

7. Phase comparison circuit of claim 6 wherein the delay time is set to a value between a half cycle and 1 cycle of the clock signal.

8. Phase comparison circuit of claim 6 in which the delay time becomes shorter as the frequency of the clock signal becomes higher.

9. Phase comparison circuit of claim 6, wherein the frequency of the clock signal is controlled according to the phase difference signal.

10. Phase comparison circuit of claim 6, which includes a reset circuit to reset the first or second edge detection signal to the initial state after a prescribed amount of time has elapsed when the first or second edge detection signal is output.

11. Phase comparison circuit of claim 3, in which the phase difference signal is held at a first level corresponding to the first control signal and at a second level corresponding to the second control signal.

12. Phase comparison circuit of claim 11, in which the phase difference signal enter a high-impedance state when the delayed signal and the clock signal are synchronous.

13. Phase comparison circuit having a single voltage-controlled delay circuit that adds a prescribed delay time of either a first or a second value to an input signal in order to output a delayed signal, a first edge detection circuit that outputs a first edge detection signal upon detecting the changing edge at which the input signal changes from the first level to the second level, a second edge detection circuit that outputs a second edge detection signal upon detecting the changing edge at which the input signal changes from the second level to the first level, a control circuit that receives the delayed signal and the first and the second edge detection signals and outputs a phase information signal corresponding to said signals, a phase detection circuit that outputs a first and a second control signal by comparing the phase of the phase information signal and the phase of the clock signal, and an output circuit that outputs a phase difference signal indicating the phase difference between the delayed signal and the clock signal according to the first and the second control signals.

14. Phase comparison circuit of claim 13 that controls the frequency of the clock signal according to the phase difference signal.

15. Phase comparison circuit of claim 13, in which the phase difference signal is held at a first level corresponding to the first control signal and at a second level corresponding to the second control signal.

16. Phase comparison circuit of claim 15, in which the phase difference signal enters a high-impedance state when the delayed signal and the clock signal are synchronous.

17. Phase comparison circuit having a delay circuit that adds a prescribed delay time of either a first or a second value to an input signal in order to output a delayed signal, a first edge detection circuit that outputs a first edge detection signal upon detecting the changing edge at which the input signal changes from the first level to the second level, a second edge detection circuit that outputs a second edge detection signal upon detecting the changing edge at which the input signal changes from the second level to the first level, a control circuit that receives the delayed signal and the first and the second edge detection signals and outputs a phase information signal corresponding to said signals, a phase detection circuit that outputs a first and a second control signal by comparing the phase of the phase information signal and the phase of the clock signal, and an output circuit that outputs a phase difference signal indicating the phase difference between the delayed signal and the clock signal according to the first and the second control signals; and wherein the delay time is controlled according to the phase difference signal.

18. Phase comparison circuit of claim 17 that sets the delay time to a value between a half cycle and 1 cycle of the clock signal.

19. Phase comparison circuit of claim 17 that controls the frequency of the clock signal according to the phase difference signal.

20. Phase comparison circuit of claim 17, in which the phase difference signal is held at a first level corresponding to the first control signal and at a second level corresponding to the second control signal.

21. Phase comparison circuit of claim 20, in which the phase difference signal enter a high-impedance state when the delayed signal and the clock signal are synchronous.

* * * * *